United States Patent

Tanabe et al.

[11] Patent Number: 6,150,059
[45] Date of Patent: Nov. 21, 2000

[54] PHOTOMASK AND METHOD OF EXPOSURE USING SAME

[75] Inventors: Hiroyoshi Tanabe; Shinji Ishida; Tadao Yasuzato, all of Tokyo, Japan

[73] Assignee: NEC Corporation, Tokyo, Japan

[21] Appl. No.: 09/181,566

[22] Filed: Oct. 29, 1998

[30] Foreign Application Priority Data

Oct. 31, 1997 [JP] Japan ..................................... 9-300251

[51] Int. Cl.⁷ ...................................................... G03F 9/00
[52] U.S. Cl. .................................................................. 430/5
[58] Field of Search ............................... 430/5, 311, 322, 430/323

[56] References Cited

U.S. PATENT DOCUMENTS 5,418,093   5/1995   Asai et al. ................................... 430/5

FOREIGN PATENT DOCUMENTS

| | | |
|---|---|---|
| 4-136854 | 5/1992 | Japan . |
| 4-268714 | 9/1992 | Japan . |
| 6-242594 | 2/1993 | Japan . |
| 6-242595 | 2/1993 | Japan . |
| 6-267822 | 3/1993 | Japan . |
| 7-64273 | 8/1993 | Japan . |
| 62-67514 | 9/1993 | Japan . |
| 7-199448 | 12/1993 | Japan . |

*Primary Examiner*—S. Rosasco
*Attorney, Agent, or Firm*—Sughrue, Mion, Zinn, Macpeak & Seas, PLLC

[57] ABSTRACT

A photomask has a plurality of main holes which pass a prescribed light beam that is shone onto positions that make up a plurality of pattern parts, at locations that are opposite a plurality of pattern parts for said semiconductor device, this photomask also having a plurality of minute auxiliary holes, which pass a light beam of a degree that is not transferred at the time of exposure, these auxiliary holes being disposed between the main holes.

16 Claims, 6 Drawing Sheets

Fig. 5
(A)
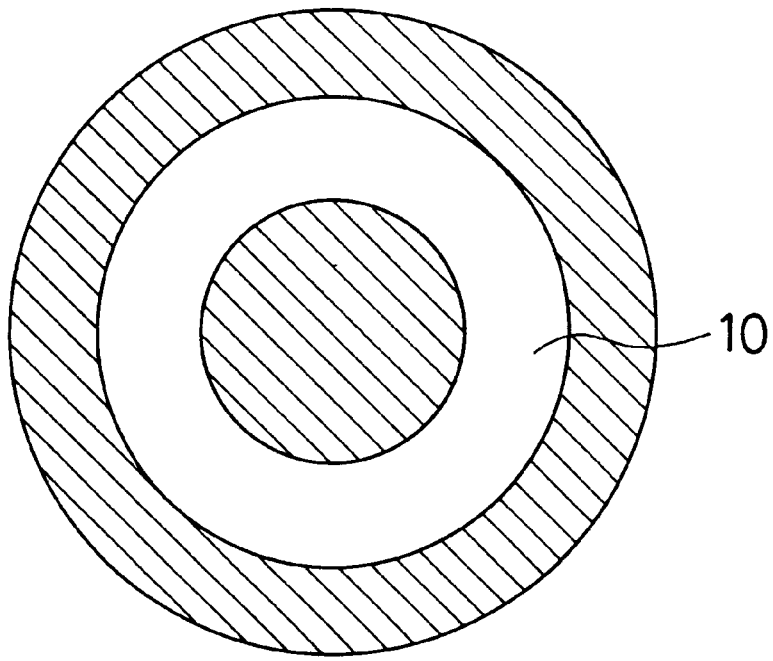
(B)
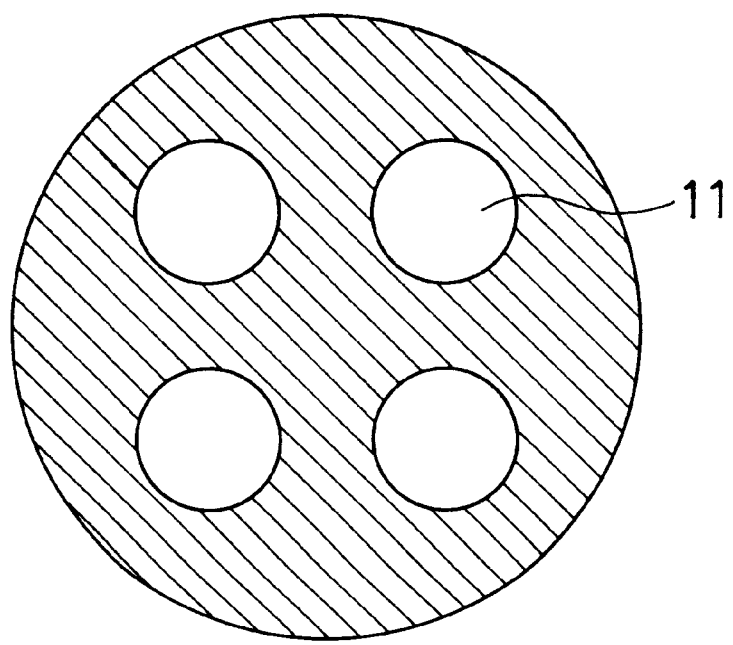

PHOTOMASK AND METHOD OF EXPOSURE USING SAME

BACKGROUND OF THE INVENTION

1. Field of the Invention

The present invention relates to a photomask used in an apparatus for manufacturing a semiconductor integrated circuit and to a method which uses this photomask to expose the pattern of a semiconductor integrated circuit.

More specifically, it relates to a mask for forming the contact holes of a memory device and to a contact hole exposure method.

2. Description of Related Art

In the past, the increasing level of integration of semiconductor integrated circuits has resulted in a rapid shrinking of circuit patterns used therein. However, the lithography technology that uses a projection-type exposure apparatus has a limit of resolution that is related to the wavelength of the light source.

In recent years, there have been various methods proposed for achieving ultra-high resolution, such as the method of using a phase-shift mask or using illumination of a particular shape to improve the resolution.

One known half-tone phase-shift mask for the purpose of improving the resolution for hole patterns, is known by its disclosure in the Japanese Unexamined Patent Publication (KOKAI) No. 4-136854. With a half-tone phase-shift mask, a translucent phase-shift mask is used in place of the usual light-blocking film.

However, when a half-tone phase-shift mask is used, because of the very small amount of light that passes through the translucent phase-shift mask, there is a region of strong light intensity surrounding the hole pattern, this being known as a side lobe.

In the case of a memory device, therefore, in which the spacing between contact holes is narrow, as the size of features becomes smaller, these side lobes overlap with one another, so that unwanted side lobes are transferred onto the resist.

Another known method of improving the resolution for hole patterns other than the use of a half-tone phase-shift mask is that, for example, which is disclosed in the Japanese Unexamined Patent Publication (KOKAI) No. 4-268714.

This method, as shown in FIG. 6, makes use of a mask onto which are provided auxiliary holes 5, which are below the resolving limit of the projection lens, in the vicinity of the area surrounding the hole pattern 4.

By exposing through this mask using a ring-shaped light source 10 as shown in FIG. 5(A) or a four-point light source 11 as shown in FIG. 5(B), it is possible to improve the hole resolution.

These types of masks are effective for use with a hole pattern of sparsely distributed isolated holes.

Another method is that which is disclosed in the Japanese Unexamined Patent Publication (KOKAI) No. 62-67514, in which is presented a proposal, as shown in FIG. 7, of a mask which is provided with auxiliary shifters 9, which surround the hole pattern 4, and which shift the phase of the light passing therethrough by 180 degrees, these being of a size that is smaller than the resolving limit of the projection lens.

This mask imparts a phase shift effect to isolated holes, and improves the resolution when used with illumination having a small numerical aperture σ of 0.3 or smaller in an illumination optical system.

A mask with auxiliary holes or auxiliary shifters such as shown in FIG. 6 and FIG. 7 is effective with respect to isolated holes.

However, the arrangement of holes in the contact hole pattern of a memory device, such as shown in FIG. 3, has parts in which the holes are arranged in high concentration.

For example, in the case of the capacitive contact hole that is shown in FIG. 3(C), it is not possible to provide auxiliary holes or auxiliary shifters that surround the hole pattern 4.

Accordingly, it is an object of the present invention to provide a photomask that alleviates the above-noted problems which accompanied the prior art and which improves the resolution of a contact hole pattern of a memory device, and to provide an exposure method which uses this photomask.

SUMMARY OF THE INVENTION

To achieve the above-noted object, the present invention has the following basic technical constitution.

Specifically, the first aspect of the present invention is a photomask for the purpose of forming a plurality of pattern parts on at least part of the pattern of a semiconductor device, this mask having a plurality of main holes at locations which are opposite the positions at which the above-noted plurality of pattern parts are to be formed, each one of these main holes passes a prescribed light beam that is irradiated thereonto, this photomask further having at the plurality of minute auxiliary holes between the main holes and each of which passes a light beam therethrough that is of a degree that does not transfer to a surface of a substrate at the time of exposure.

The second aspect of the present invention is a photomask which has an optical phase shifter provided at at least one of the mutually adjacent main and auxiliary holes of the plurality of main and plurality of auxiliary holes.

Additionally, the third aspect of the present invention is a method of exposure which uses a photomask according to the first aspect of the present invention to perform exposure using deformed illumination in which the surrounding area of the illumination light source is bright.

The fourth aspect of the present invention is a method of exposure which uses a photomask according to the second aspect of the present invention to perform exposure using illumination from a light source with an illumination optical system having a small numerical aperture.

By adopting the above-noted technical constitution, a photomask according to the present invention can be used, for example, as a photomask having the contact hole pattern for a memory device.

As a specific example of the configuration thereof, matrix lines would be drawn between the above-noted contact hole patterns to connect those holes, thereby establishing the points of intersection of the matrix lines with minute auxiliary holes that are not transferred to a surface of a substrate when it is exposed being added at some or all of the matrix points at which there is no contact hole pattern.

In a method according to the present invention of performing exposure, using a prescribed light beam, so as to form a prescribed pattern in, for example, a resist, for the purpose of forming a circuit part of a semiconductor, in the case in which a photomask without the above-noted phase-shifting means is used, it is desirable that the exposure be performed using deformed illumination, in which the peripheral area of the illumination is bright and, in the case in which a photomask having the above-noted phase shifters

BRIEF DESCRIPTION OF THE DRAWINGS

FIG. 5(A) and FIG. 5(B) are plan views which show the shapes of deformed illumination according to the present invention.

DETAILED DESCRIPTION OF THE PREFERRED EMBODIMENTS

An embodiment of the present invention will be described in detail below, with reference being made to relevant accompanying drawings.

Figure 1:
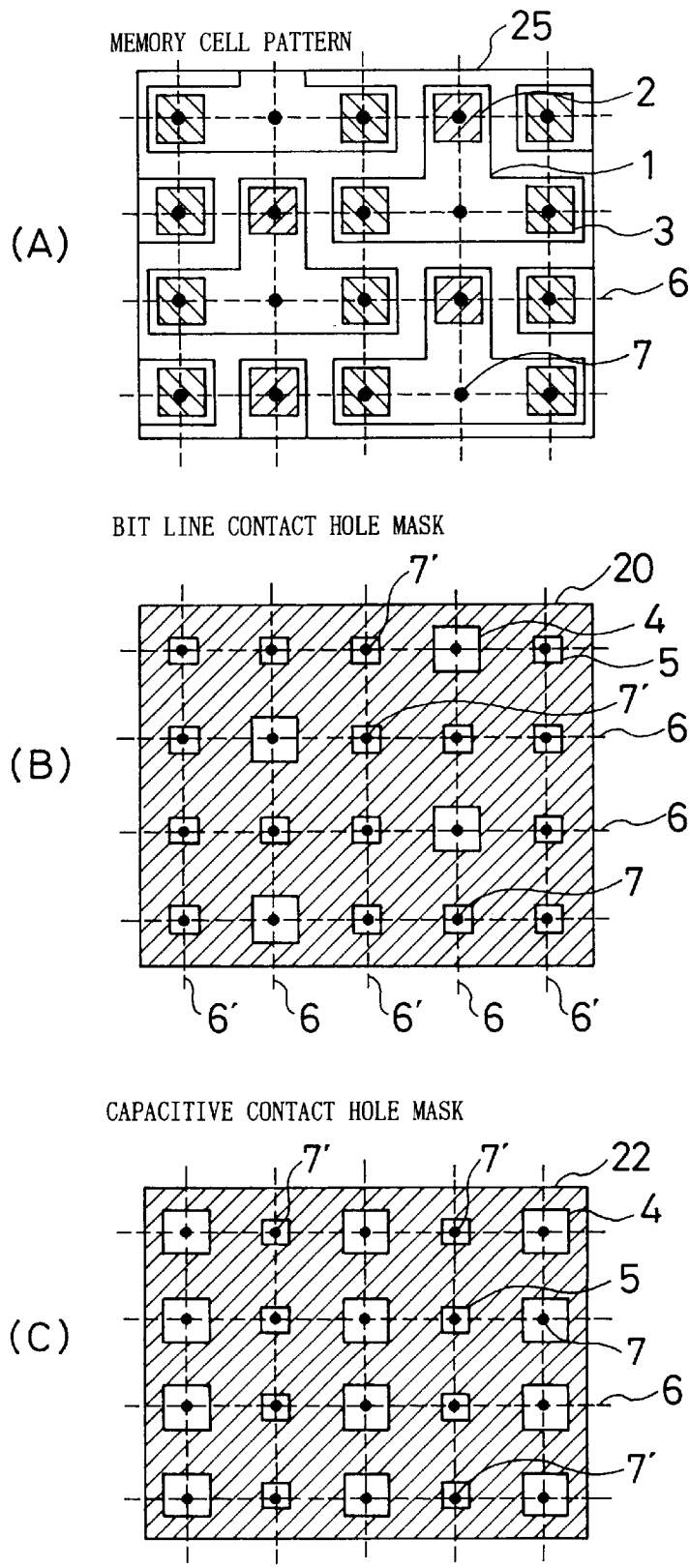
FIG. 1(A) is a plan view which shows an example of the configuration of the pattern of a semiconductor circuit to be described using a photomask according to the present invention.
FIG. 1(B) is a plan view which shows the configuration of a specific example of a photomask that is used for the bit line contact holes according to the present invention.
FIG. 1(C) is a plan view which shows a specific example of a photomask that is used for capacitive contact holes according to the present invention.

Specifically, FIG. 1(B) and FIG. 1(C) are plan views which show examples of photomasks 20 and 22 according to the present invention, in which in order to form a plurality of pattern parts of at least part of the semiconductor element pattern 25 shown in FIG. 1(A), for example, the bit line contact holes 2 or capacitive contact holes 3, at locations which are in opposition to locations at which parts 2 or 3 are to be formed, a plurality of main holes 4 which cause the passage of a prescribed light beam irradiated to each one of portions on which the patterns 2 or 3 of a plurality of the pattern, is formed, respectively, are provided.

On these photomasks 20 and 22, there are further disposed between the main holes 4 minute auxiliary holes 5 that pass a light beam of a degree that is not transferred at the time of exposure.

It is desirable that the semiconductor device which uses the photomasks 20 and 22 according to the present invention be a memory device, and at least part of the pattern of this semiconductor device can be either contact holes 2 or capacitive contact holes 3, the present invention presenting no restriction in this regard.

That is, it is desirable that the main hole 4 and auxiliary hole 5 in the present invention be arranged so as to form a periodic hole group within the photomasks 20 and 22.

By adopting the above-noted configuration, it is possible, as will be described below, to establish a deep focal depth of field when performing exposure.

While the groups of auxiliary holes 5 provided in the photomasks 20 and 22 in the present invention are provided at prescribed positions with respect to each of the groups of main holes 4, this not necessarily being restricted to the center part thereof, it is desirable that they be provided at either the intersection points 7 of virtual matrix lines 6 that run between prescribed positions in two directions, or at intersection points 7 of virtual lines 6' that would be formed by dividing the above-noted virtual matrix lines 6 into equal divisions.

Figure 3:
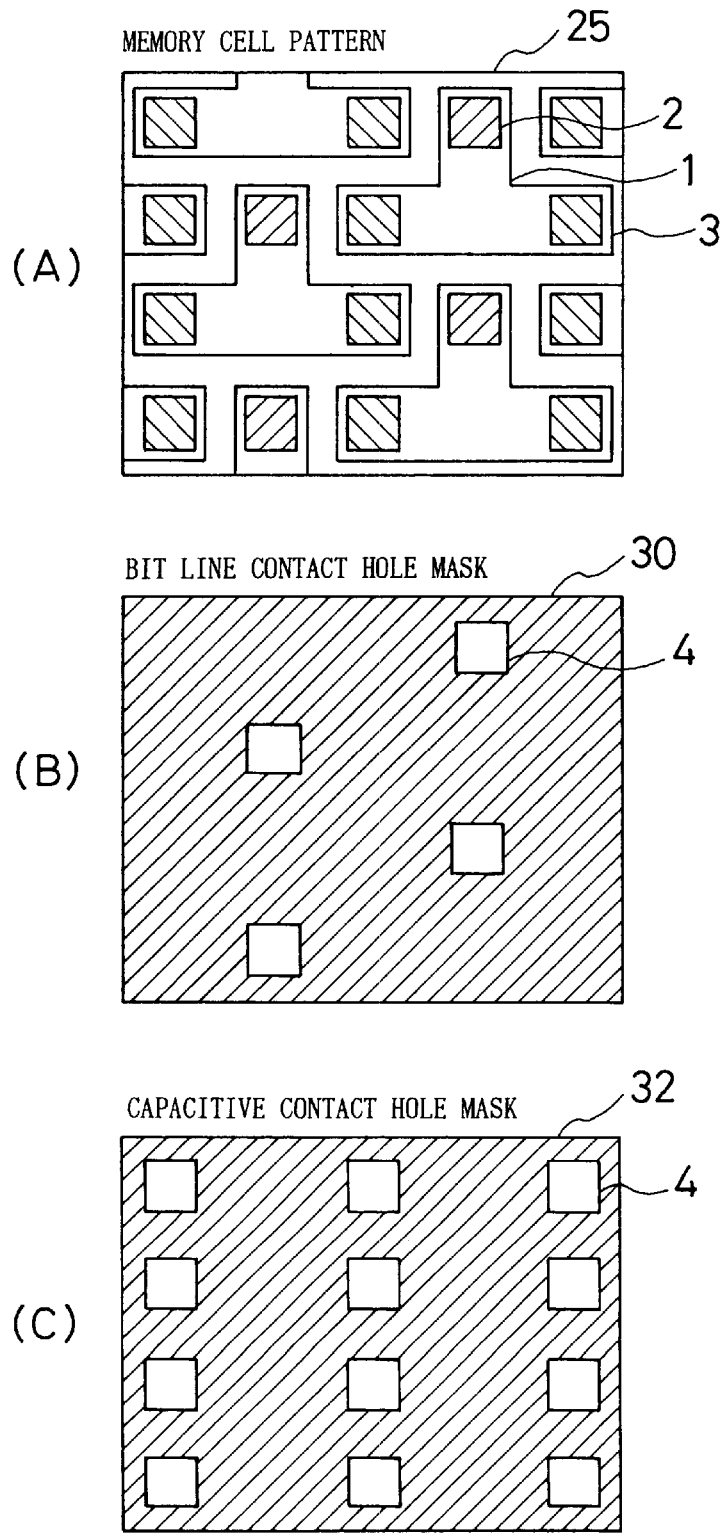
FIG. 3A is a plan view which shows an example of the configuration of a pattern of a semiconductor circuit to be described using a photomask according to the prior art.
FIG. 3(B) is a plan view which shows the configuration of a specific example of a photomask that is used for bit line contact holes according to the prior art.
FIG. 3(C) is a plan view which shows the configuration of a specific example of a photomask that is used for capacitive contact holes according to the prior art.

The pattern structure that is shown in FIG. 1(A), which is the pattern 25 of a semiconductor device that is to be used in photomasks 20 and 22 of the present invention, has the same pattern configuration as the pattern structure shown as the prior art in FIG. 3(A) and, in the same manner, the structure of the photomask 20 for the bit line contact holes, which is shown in FIG. 1(B) corresponds to the photomask 30 for the bit line contact holes in the prior art as shown in FIG. 3(B), and the structure of the photomask 22 for the capacitive contact holes shown according to the present invention as shown in FIG. 1(C) corresponds to that of the photomask 32 for bit line contact holes in the prior art, as shown in FIG. 3(C).

That is, the photomask 20 according to the present invention consists of the photomask 30 of the prior art, as shown in FIG. 3(B), with the addition of the auxiliary holes 5, the action of which is to intentionally cause a diffraction of the light beam used for exposure, thereby increasing the focal depth of field.

Specifically, in a first example of the present invention, there is an activated region 1 having a convex memory cell pattern as shown in FIG. 1(A) (the same pattern is formed as shown in FIG. 3(A)) that is formed periodically and in a concentrated pattern.

When this is formed, the bit line contact holes 2 and capacitive contact holes 3 are disposed so as to be positioned at the points of intersection 7 of the matrix lines 6 that connect the contact holes.

In the bit line contact hole mask 20 that is shown in FIG. 1(B), the auxiliary holes 5 that are smaller than the resolving limit are disposed at intersection points other than the locations of hole patterns 4.

By doing this, there are holes at all of the matrix points, thereby resulting in a periodic hole pattern.

In the capacitive contact hole mask 22 shown in FIG. 1(C) as well, auxiliary holes 5 smaller than the resolving limit are disposed at matrix points other than the locations of the hole patterns 4, the result being that holes are located at all of the matrix points, thereby forming a period hole pattern.

In the present invention, when using the photomask 20 or 22 to expose a light beam to a substrate to form a prescribed semiconductor circuit, with respect to a periodic hole pattern such as shown in FIG. 1(B) or FIG. 1(C), it is particularly effective to use deformed illumination such as shown in FIG. 5(A) or FIG. 5(B), in which the peripheral area is bright.

Figure 4:
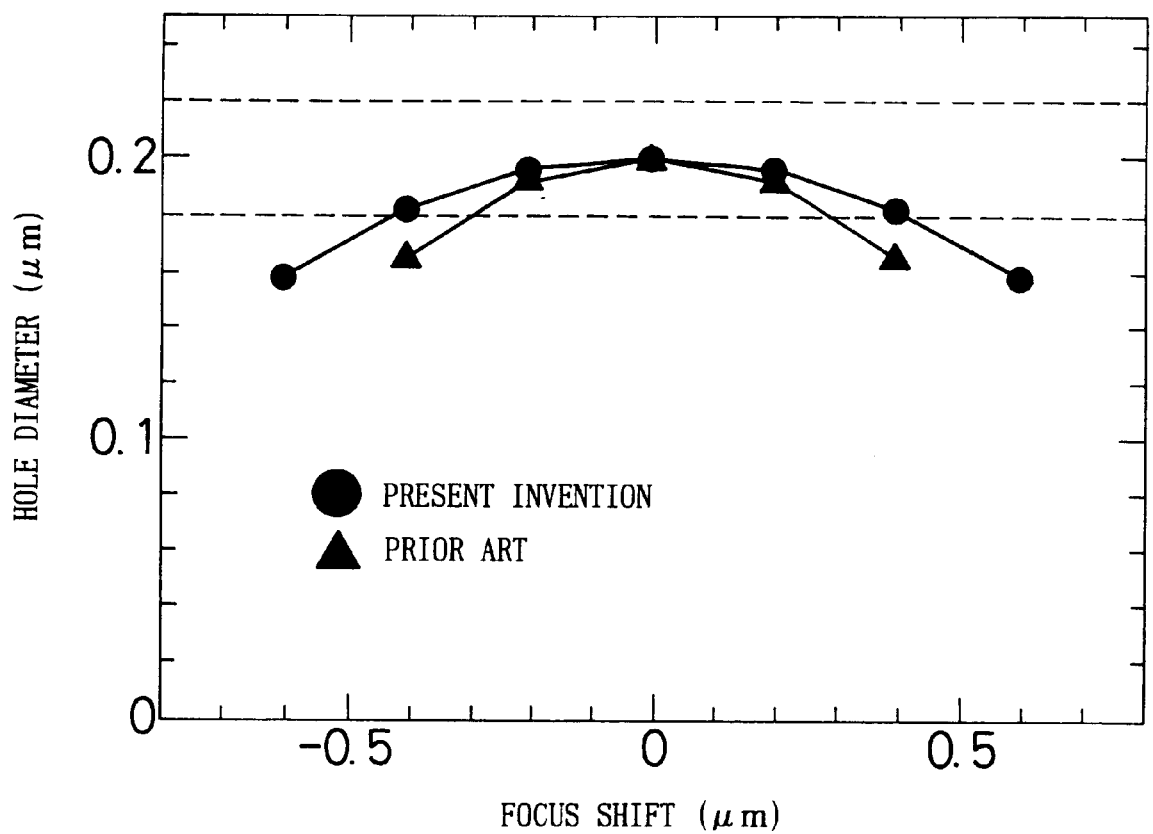
FIG. 4 is a graph which shows the difference between the focal depth of field of a prior art photomask and a photomask according to the present invention.
Figure 6:
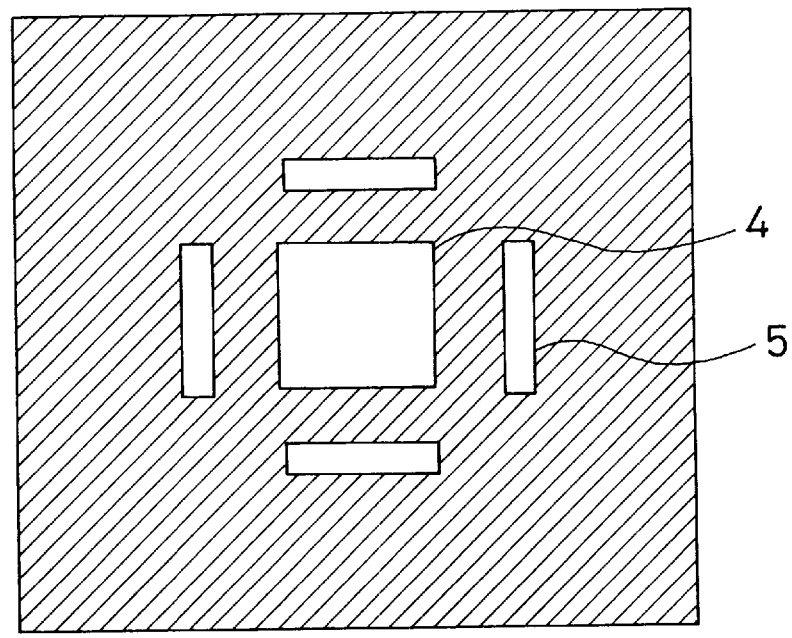
FIG. 6 is a plan view which shows an example of a photomask for isolated holes, in which the auxiliary holes of the past are used.
Figure 7:
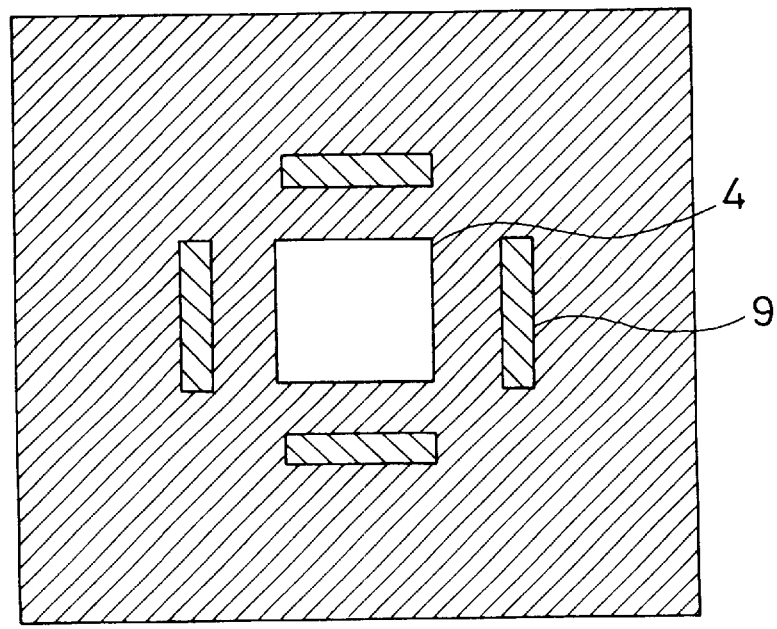
FIG. 7 is a plan view which shows an example of a photomask for isolated holes, in which the auxiliary shifters of the past are used.

FIG. 4 shows a simulation comparison of the focal depth of field of a transferred hole diameter obtained using the photomask 22 of the present invention that is shown in FIG. 1(B) and the photomask 30 of the prior art that is shown in FIG. 3(B).

Specifically, with a hole pattern 4, the size of which is 0.2 $\mu$m and an auxiliary hole 5, the size of which being 0.15 $\mu$m, using a ring-shaped light source such as shown in FIG. 5(A), the light source outer diameter of the light source was $\sigma$=0.9 and the inner diameter was $\sigma$=0.6.

The numerical aperture of the projection system was 0.5. In the case of using a prior art photomask 30 for which the focal depth of field was within 0.2±0.02 $\mu$m, the transferred hole diameter was 0.4 $\mu$m, whereas with the photomask 20 of the present invention, the transferred hole diameter increased to 0.8 $\mu$m.

Figure 2:
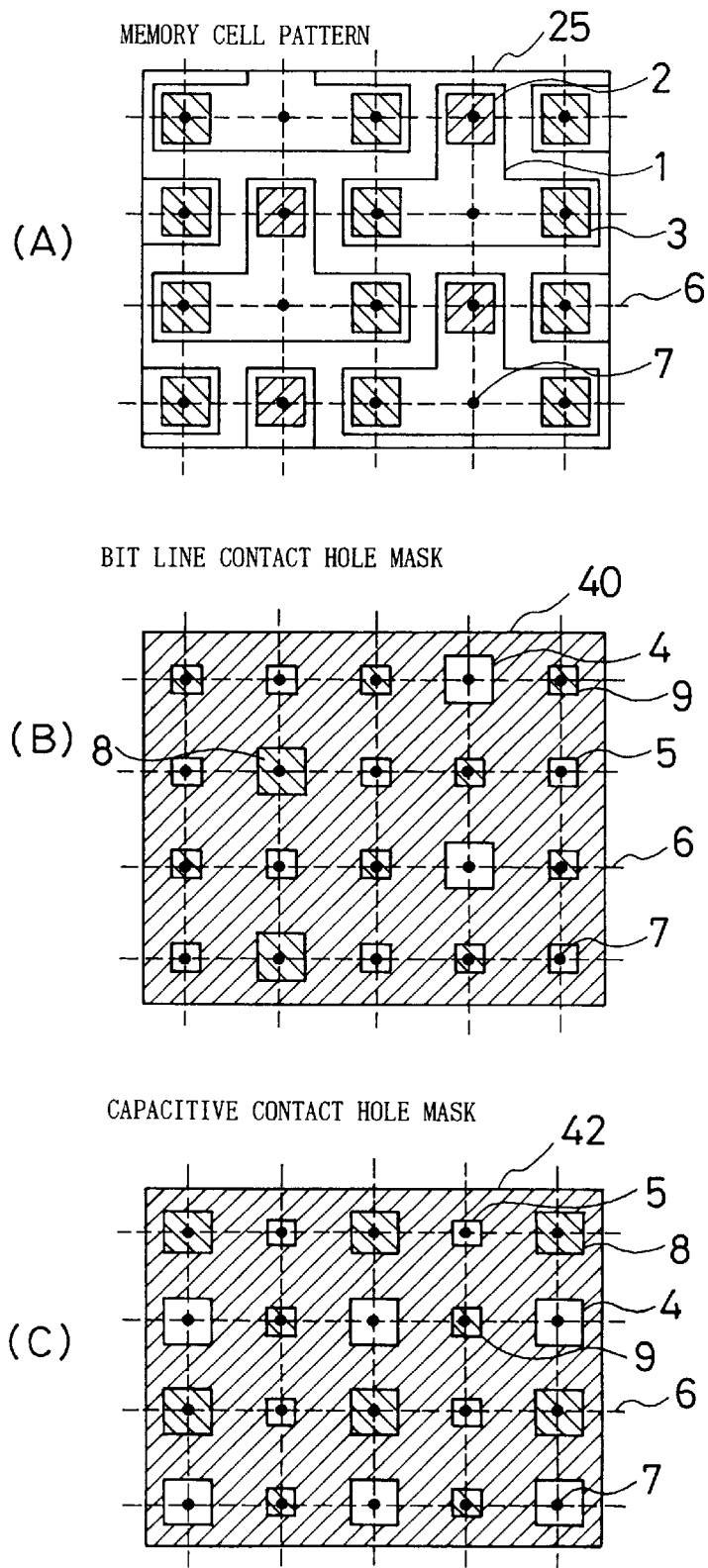
FIG. 2(A) is a plan view which shows an example of the configuration of the pattern of a semiconductor circuit to be described using a photomask according to the present invention.
FIG. 2(B) is a plan view which shows another specific example of a photomask that is used for the bit line contact holes according to the present invention.
FIG. 2(C) is a plan view which shows another specific example of a photomask that is used for capacitive contact holes according to the present invention.

In another form, the photomask of the present invention is a photomask as shown in FIG. 2(B) and FIG. 2(C), which has a contact hole pattern for a memory device. In the former case, this is the photomask 40 for bit line contact holes, and in the latter case this is the photomask 42 for capacitive contact holes, these being the same as the first example of the present invention.

Additionally, in the present invention matrix lines 6 are drawn so as to join the above-noted contact hole patterns, thereby establishing the matrix points 7 at the locations at which these matrix lines intersect each other, minute auxiliary holes 5 that are not transferred when exposure is done being disposed at part or all of these matrix points at which a contact hole pattern does not exist, a phase shifter 9 being placeed at every other contact hole pattern 4 and auxiliary hole 5 at the matrix points 7, this phase shifter 9 shifting the phase of light which passes through the contact hole pattern and auxiliary hole 5 by 180 degrees.

Specifically, in the present invention, in addition to the main holes 4 and auxiliary holes 5 being disposed in a matrix arrangement, an optical phase shifter means 9 is provided at a hole of one of the main holes 4 and the auxiliary holes 5, which being mutually and adjacently arranged to each other, thereby form a hole with shifter 8 thereat.

The optical phase shifter means 9 of the present invention is not limited to any particular configuration and can be, for example, a plate-shaped element made chiefly of glass which enables the achievement of a prescribed phase shift in a prescribed location of the holes 4 or 5 of the photomask 40 and 42, and can also be configured so as to achieve a prescribed phase shift by removing a prescribed amount of thickness from a glass substrate that has the holes of the photomask.

That is, in the second example of the present invention, as shown in FIG. 2(B), in the bit line contact hole mask 40, auxiliary holes 5 are disposed at matrix point locations 7 at which there is no hole pattern 4, these auxiliary holes being smaller than the resolving limit.

By doing this, there are holes 4 and 5 at every matrix point 7, thereby resulting in a periodic hole pattern, with a phase shifter means 9 being disposed every other hole pattern 4 or auxiliary hole 5.

In the capacitive hole pattern mask 42 shown in FIG. 2(C) as well, auxiliary holes 5 are disposed at matrix point locations 7 at which there is no hole pattern 4, thereby resulting in a periodic hole pattern in which there are holes at every matrix point 7.

In the above-noted case as well, there is a phase shifter means 9 disposed at every other hole pattern 4 or auxiliary hole 5.

A photomask 40 or 42, as shown in FIG. 2(B) or FIG. 2(C), respectively, is a phase-shift mask that has a periodicity, and it is highly effective to use a conventional light source, as opposed to a deformed light source, with this type of mask, using high-interference illumination with a small $\sigma$ (that is, a greatly stopped-down light beam in which the ratio NA'/NA of the optics numerical aperture NA to the illumination numerical aperture NA is small).

Stated in other terms, in the second example of the present invention, it is desirable when using the above-noted photomask 40 or 42, to perform exposure with illumination from an illumination source having an optical system with a small numerical aperture.

By using the photomask and the exposure method of the present invention, the focal depth of field when transferring contact holes for a memory device is extended. Additionally, by broadening the focus margin, it is possible to effectively form patterns with smaller features, thereby making possible the exposure of semiconductor integrated circuits having a higher degree of integration.

What is claimed is:

1. A photomask for the formation of at least part of a plurality of pattern parts of a pattern of a semiconductor device, said photomask comprising a plurality of main holes each of which passes a prescribed light beam that is irradiated onto the respective positions of a substrate, that make up at least a plurality of pattern parts, at locations that are opposite said respective pattern parts for said semiconductor device on said substrate, said photomask further comprising auxiliary holes having relatively smaller size with respect to those of said respective main holes, each of which passes a light beam of a degree that is not transferred on to a surface of said substrate at the time of exposure, said auxiliary holes being disposed between said main holes and wherein said main holes and said auxillary holes are arranged within said photomask in a periodic arrangement of holes, and further wherein said auxiliary holes are provided at either the intersection points of virtual matrix lines that run between prescribed positions in two directions or at intersection points of virtual lines that would be formed by dividing the virtual matrix lines into equal divisions.

2. A photomask according to claim 1, wherein said semiconductor device is a memory device.

3. A photomask according to claim 1, wherein said at least part of a plurality of pattern parts of a semiconductor device are contact holes.

4. A photomask according to claim 1, wherein said main holes and said auxiliary holes are arranged within said photomask in a periodic arrangement of holes.

5. A photomask according to claim 1, said photomask further comprising an optical shifter means which is provided at at least one hole part of said plurality of main holes and plurality of auxiliary holes.

6. A photomask according to claim 5, said optical shifter means is provided on at least one hole of a pair of said main holes and said auxiliary holes both of which being adjacently arranged to each other.

7. A photomask according to claim 1, wherein said auxiliary holes are provided at the intersection points of virtual matrix lines that run between prescribed positions in two directions.

8. A photomask according to claim 1, wherein said auxiliary holes are provided at intersection points of virtual lines formed by dividing virtual matrix lines that run between prescribed positions in two directions into equal divisions.

9. An exposure method whereby a light beam emitted from a light beam source is irradiated on a surface of a substrate through a hole provided on a photomask and having a prescribed pattern to form a part of prescribed patterns on said substrate, wherein said method is carried out by utilizing said photomask for the formation of at least part of a plurality of pattern parts of a pattern of a semiconductor device, said photomask comprising a plurality of main holes each of which passes a prescribed light beam that is irradiated onto the respective positions of a substrate, that make up at least a plurality of pattern parts, at locations that are opposite said respective pattern parts for said semiconductor device on said substrate, said photomask further comprising auxiliary holes having relatively smaller size with respect to those of said respective main holes, each of which passes a light beam of a degree that is not transferred onto a surface of said substrate at the time of exposure, said auxiliary holes being disposed between said main holes, wherein a light beam emitted from a deformed illumination source, which is bright around the periphery thereof, is irradiated onto said substrate through either of said main holes or said auxiliary holes of said photomask, said main holes and said auxiliary holes being arranged within said photomask in a periodic arrangement of holes, and further wherein said auxiliary holes are provided at either the intersection points of virtual matrix lines that run between prescribed positions in two directions or at intersection points of virtual lines that would be formed by dividing the virtual matrix lines into equal divisions.

10. An exposure method according to claim 9, wherein illumination having an optics system that has a small numerical aperture is used.

11. An exposure method according to claim 9, wherein some of said holes of either one of said main holes or said auxiliary holes of said photomask are provided with an optical shifter means.

12. An exposure method according to claim 9, wherein said deformed illumination source is annular with an outermost area, a middle area and a inner area, wherein the outermost layer is dark, the middle area is a source of illumination and the inner area is dark.

13. An exposure method according to claim 9, wherein the illumination source is darkened except for four illumination points dispersed in a circular darkened illumination source.

14. An exposure method according to claim 9, wherein at least one auxiliary hole causes diffraction of the light beam used for exposure, thereby increasing the focal depth of the field.

15. An exposure method according to claim 9, wherein there are a plurality of auxiliary holes which are smaller than the resolving limit and are disposed at intersection points other than the locations of main hole patterns.

16. An exposure method according to claim 9, wherein a phase shifter is placed at main holes and auxiliary holes at matrix points between a contact hole and an auxiliary hole.

\* \* \* \* \*